(12) United States Patent
Wang et al.

(10) Patent No.: US 8,298,336 B2
(45) Date of Patent: Oct. 30, 2012

(54) HIGH STRIP RATE DOWNSTREAM CHAMBER

(75) Inventors: Ing-Yann Wang, Moraga, CA (US);
Jaroslaw W. Winniczek, Daly City, CA (US); David J. Cooperberg, Mount Kisco, NY (US); Erik A. Edelberg, Castro Valley, CA (US); Robert P. Chebi, San Carlos, CA (US)

(73) Assignee: Lam Research Corporation, Fremont, CA (US)

( * ) Notice: Subject to any disclaimer, the term of this patent is extended or adjusted under 35 U.S.C. 154(b) by 999 days.

(21) Appl. No.: 11/096,820

(22) Filed: Apr. 1, 2005

(65) Prior Publication Data

US 2006/0219361 A1     Oct. 5, 2006

(51) Int. Cl.
| C23C 16/455 | (2006.01) |
| C23C 16/458 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. ............. 118/715; 156/345.33; 156/345.34; 156/345.51; 118/728

(58) Field of Classification Search .................. 118/715, 118/728; 156/345.33, 345.34, 345.51
See application file for complete search history.

(56) References Cited

U.S. PATENT DOCUMENTS

| 5,637,180 A | 6/1997 | Gosain et al. |
| 5,643,394 A * | 7/1997 | Maydan et al. .......... 156/345.33 |
| 5,792,269 A | 8/1998 | Deacon |
| 5,993,679 A | 11/1999 | Koide et al. |
| 6,302,965 B1 * | 10/2001 | Umotoy et al. ............... 118/715 |
| 6,453,992 B1 * | 9/2002 | Kim ............................ 165/206 |
| 6,586,886 B1 | 7/2003 | Katz |
| 6,782,843 B2 | 8/2004 | Kinnard et al. |
| 2003/0111961 A1 | 6/2003 | Katz |
| 2004/0261708 A1 | 12/2004 | Selvamanickam |

(Continued)

FOREIGN PATENT DOCUMENTS

EP     0768702 A1     4/1997

(Continued)

OTHER PUBLICATIONS

International Search Report for PCT/US06/09972 mailed Jul. 3, 2008.

(Continued)

*Primary Examiner* — Rudy Zervigon
(74) *Attorney, Agent, or Firm* — Brinks Hofer Gilson & Lione (57) ABSTRACT

A gas chamber contains upper and lower chamber bodies forming a cavity, a heating chuck for a wafer, a remote gas source, and an exhaust unit. Gas is injected into the cavity through channels in an injector. Each channel has sections that are bent with respect to each other at a sufficient angle to substantially eliminate entering light rays entering the channel from exiting the channel without reflection. The channels have funnel-shaped nozzles at end points proximate to the chuck. The injector also has thermal expansion relief slots and small gaps between the injector and mating surfaces of the chamber and gas source. The temperature of the injector is controlled by a cooling liquid in cooling channels and electrical heaters in receptacles of the injector. The upper chamber body is funnel-shaped and curves downward at an end of the upper chamber body proximate to the chuck.

28 Claims, 9 Drawing Sheets

U.S. PATENT DOCUMENTS

2006/0096540 A1 5/2006 Choi

FOREIGN PATENT DOCUMENTS

| | | |
|---|---|---|
| JP | H08-097155 | 4/1996 |
| JP | H09-186140 | 7/1997 |
| JP | H11-140652 | 5/1999 |
| JP | H11-297672 | 10/1999 |
| WO | WO 03/036680 | 1/2003 |
| WO | PCT/US2006/009972 | 4/2005 |

OTHER PUBLICATIONS

International Search Report for SG 200708921-2, mailed Dec. 1, 2008.

International preliminary report on patentability, PCT/US2006/009972, Apr. 2, 2009 (9 pages).

* cited by examiner

HIGH STRIP RATE DOWNSTREAM CHAMBER

FIELD OF THE INVENTION

The present application relates to the field of wafer processing. More particularly, the application relates to an etching chamber used in wafer processing.

BACKGROUND

Photoresist removal (stripping) is a frequently used process in semiconductor integrated circuit (IC) fabrication. Photoresist is used to define particular patterns on wafers. It is used during lithography, ion implantation and plasma etching (where material other than the photoresist is removed), for example. After these processes, the photoresist is removed from the wafers before continuing to the next process.

Since photoresist stripping is used frequently in semiconductor manufacturing foundries, strippers are designed to have very short process time, i.e. high throughput, to reduce the overall wafer manufacturing cost. While different ways exist to increase a stripper's throughput, they fall into two categories: overhead reduction and strip rate improvement. Overhead includes wafer handling time, pump down time of the chamber into which the wafer is loaded, stabilization of pressure inside the chamber, wafer heating, and backfill of the chamber with a desired gas, all of which prepare a wafer for the particular process. The strip rate is a measure of how fast the photoresist is removed and cleaned from the wafer surface. The strip rate also determines how long a wafer is exposed to plasma. A wafer's exposure time to plasma in a strip chamber is generally minimized to reduce the possibility of electrical damage to various circuits on the wafer. The strip rate can be increased by using a higher plasma source power, higher wafer temperature, higher process gas flow or changing the gas chemistry.

Most strippers have an entrance hole through which a gas is injected into a chamber containing a wafer to be processed. The typical vertical distance between the entrance hole and the wafer is a few inches. This distance is minimized so that the chamber is compact and economical to manufacture. To obtain a uniform strip pattern, a uniform vertical flow for the gas at the wafer surface is maintained. At typical flow rates that are used, however, the gas will not fan out in a few inches. Thus, to achieve a uniform flow in such short distance, a gas dispersion system is used to disperse the gas stream to the wafer.

Figure 1:
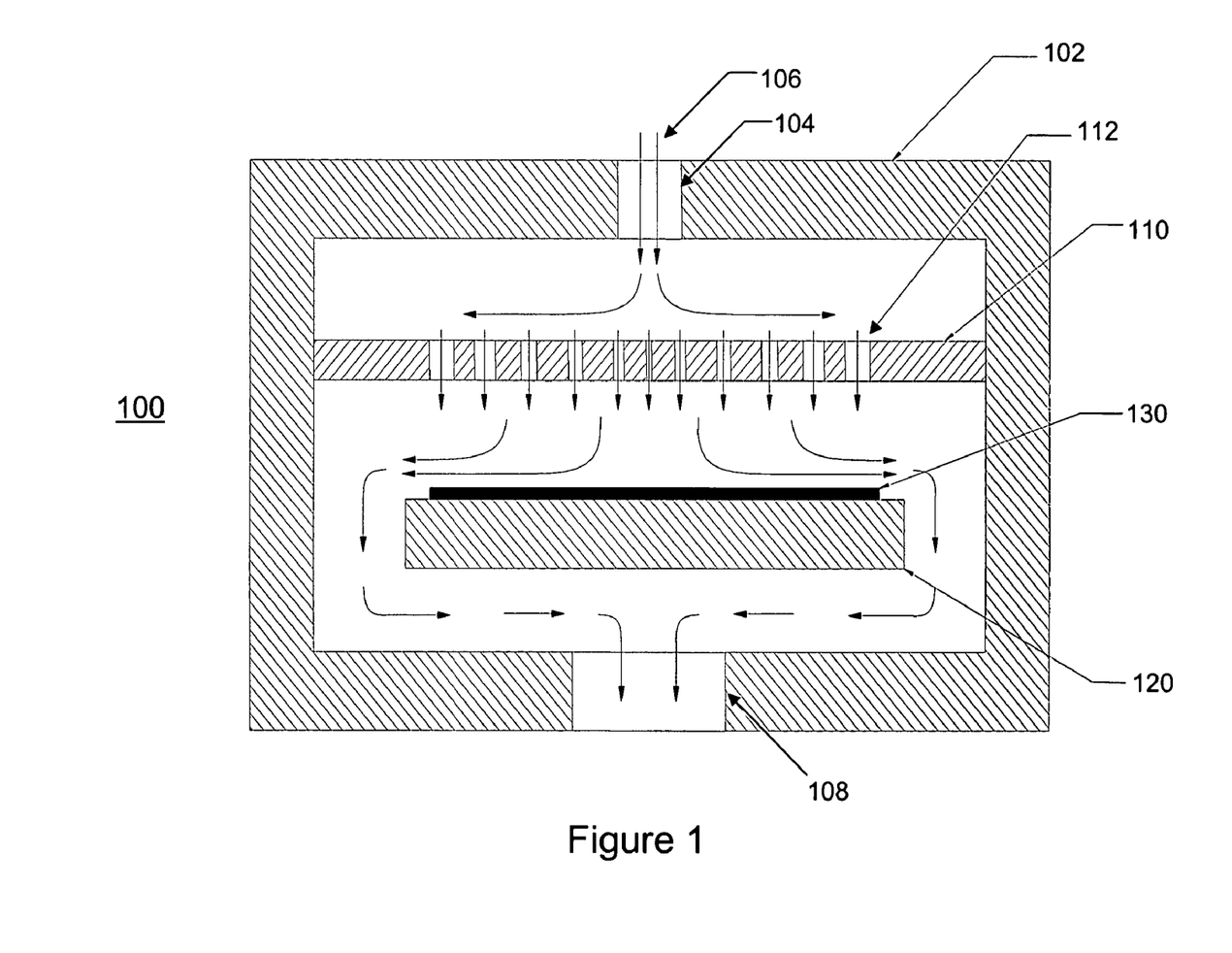
FIG. 1 illustrates a known single-baffle stripper chamber.
Figure 2:
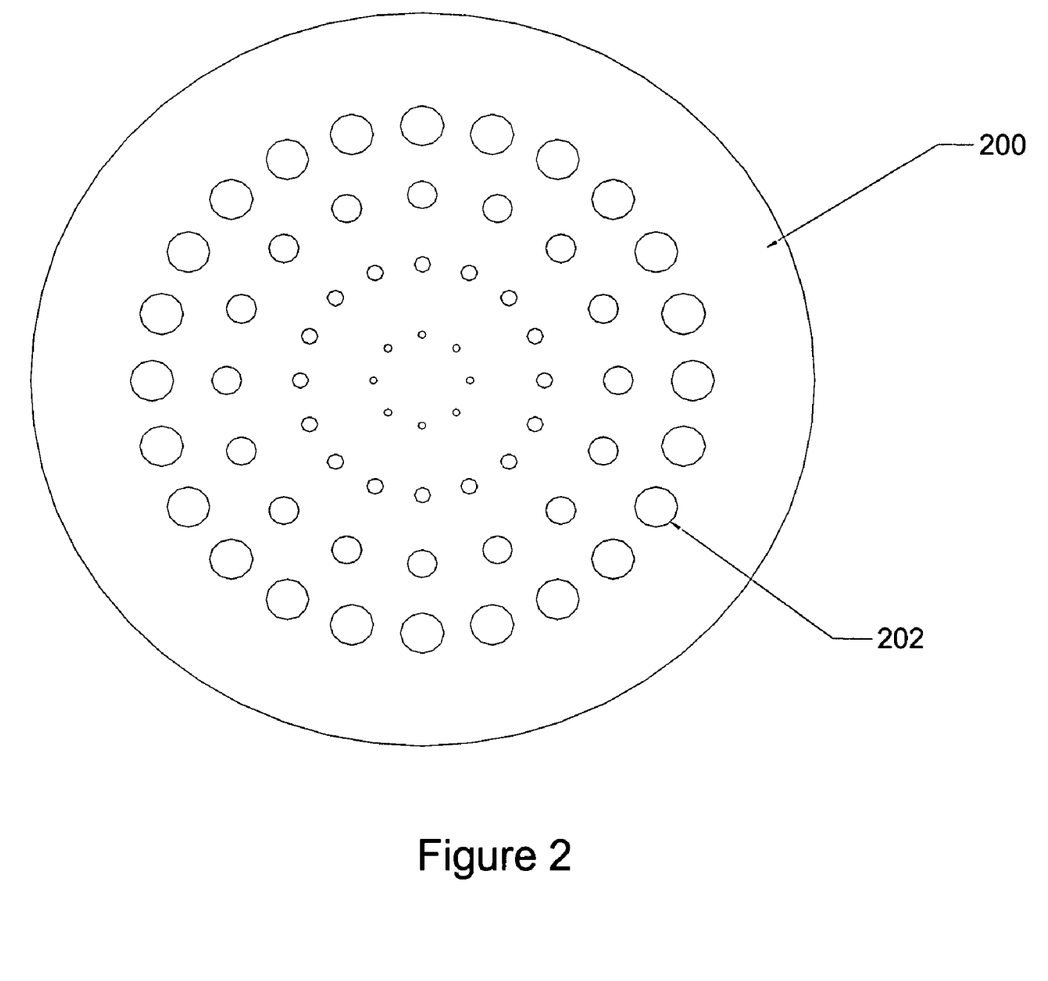
FIG. 2 illustrates the baffle of FIG. 1.

As shown in FIG. 1, a known stripper 100 contains a downstream chamber 102 in which the wafer 130 is exposed to the gas. The wafer 130 is held by a chuck 120. The gas 106 enters the downstream chamber 102 through an entrance hole 104. As the gas 106 enters the chamber, a gas dispersing system such as a baffle 110 disperses the gas 106 to distribute the gas 106 evenly onto the wafer 120. The strip uniformity and the strip rate are highly dependent upon this gas dispersing system. As shown in FIGS. 1 and 2, the baffle 110, 200 contains a large number of holes 112, 202 of different sizes. More specifically, the sizes of the holes increase with increasing distance from the center of the baffle because the center of the baffle receives more gas flow than does the edge. The gas 106, after acting on the wafer 120, exits from an exit port 108.

Figure 3:
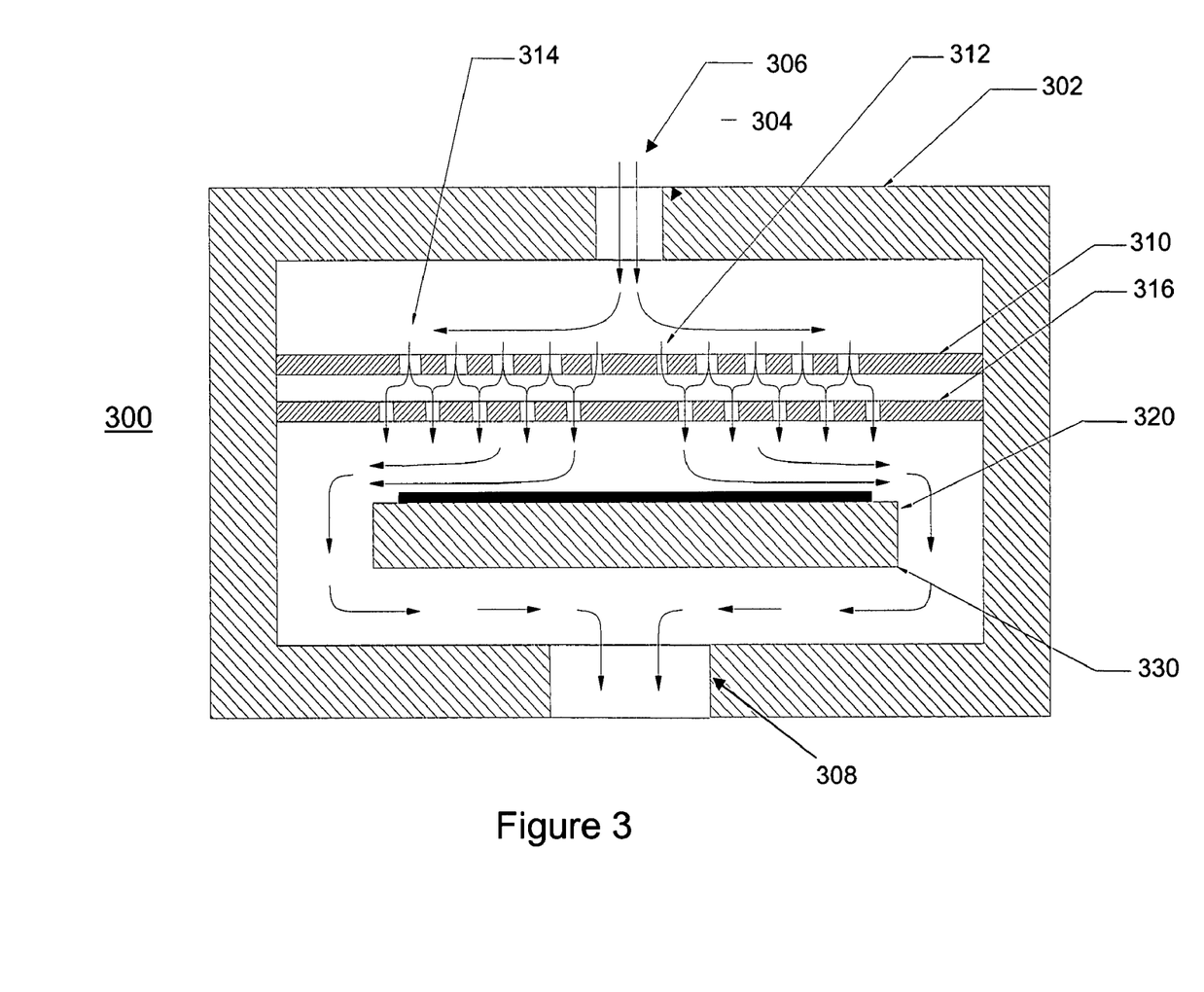
FIG. 3 illustrates a known multi-baffle stripper chamber.

Other strippers 300 contain a downstream chamber 302 in which the wafer 330 is exposed to the gas as shown in FIG. 3. The wafer 330 is held by a chuck 320. The gas 306 enters the downstream chamber 302 through an entrance hole 304. As the gas 306 enters the chamber, a multiple baffle system baffle disperses the gas 306 to distribute the gas 306 evenly onto the wafer 320. The first baffle 310 contains holes 312, 314 of two different sizes similar to that described above. The second baffle 316 contains holes of only one size, which are offset from the holes in the first baffle 310 so gas molecules that pass through the holes on the first baffle 310 have to make two 90° turns before leaving the holes at the second baffle 316. The gas 306, after acting on the wafer 320, exits from an exit port 308.

Although not shown, in another design to disperse gas, a showerhead is used. A showerhead is similar to a baffle, however, the number and size of holes are such that they create a back pressure. Back pressures of about 10 Torr or greater are produced by such a design. The creation of these back pressures effectively slows down the gas flow above the showerhead and reduces the effect of flow dynamics.

However, it is complicated to optimize the hole sizes and pattern for the single baffle design. Baffles used in single baffle designs are also expensive to manufacture due to the various sizes and the large number of holes. Similarly, while multiple baffle designs may simplify the hole pattern, the use of multiple baffles increases the size and weight of the chamber, as well as increasing the cost of material, if not fabrication. In showerhead designs, the higher up stream pressure not only lowers the ionization efficiency of the gas source but also increases the radical recombination, and consequently lowers the strip rate.

Furthermore, the large surface area created by the baffles or showerhead and the internal shape of the upper chamber permit rapid neutralization of the radicals in the gas, which actually produce the stripping of the photoresist. Without a baffle, the stripping rate is two to three times as much as that with a baffle. This means that the baffle neutralizes more than half of the radicals generated by the gas source.

BRIEF SUMMARY

A gas chamber is provided with a chamber design and gas dispersing component designed to improve gas flow and increase the strip rate without using expensive single or multiple baffles. By way of introduction only, in one embodiment, an apparatus contains upper and lower chamber bodies forming a cavity, a gas source providing gas for the cavity, an exhaust unit through which the gas in the cavity is removed, a chuck disposed in the cavity and an injector containing channels extending therethrough. Each channel is bent enough to substantially block light rays entering the channel from directly exiting the channel, i.e. from exiting the channel without undergoing at least one reflection within the channel.

In another embodiment, the apparatus contains a single fixture between the gas source and the cavity through which the gas passes to enter the cavity. The fixture has channels with portions that bend at a substantially perpendicular angle from each other.

In another embodiment, the apparatus contains an injection means for introducing the gas from the gas source into the cavity through channels while blocking radiation from the gas source from passing through the channels. In various further embodiments, ends of the channels may comprise ejection means for angling gas ejected from the channels into the chamber at angles different from angles of the channels; the upper chamber body may comprise guiding means for guiding the gas in the cavity ejected by the injection means; and/or the injection means may comprise means for absorbing thermal expansion of the injection means, means for eliminating rubbing of mating surfaces of the injection means and at least one of the upper chamber body and gas source, and/or means for adjusting a temperature of the injection means.

In another embodiment, a method includes injecting a gas into a cavity, towards a wafer, through channels in an injector that bend enough to prevent light from passing straight through the channels, the cavity formed by upper and lower chamber bodies, shaping the flow of the gas using at least angles of the channels through which the gas flows, angles of ends of the channels from which the gas is ejected, and angles of internal surfaces of the upper and lower chamber bodies, and removing the gas that has impinged on the wafer through an exhaust vent.

In a further embodiment, at least one of the channels has a first inclination angle in an upper section of the injector substantially perpendicular to a second inclination angle of a lower section of the injector. At least one of the first and second inclination angles may be oblique from a central axis of the injector. The first inclination angle may range from about 0° to 60° from the central axis of the injector while the second inclination angle ranges from about 10° to 60° from the central axis of the injector.

In another embodiment, a nozzle at an end of at least one of the channels has a diameter greater than a diameter of the remainder of the channel. The diameter of the nozzle may increase with decreasing distance to the end of the channel and be funnel-shaped. An angle at the end of the nozzle adjacent to an internal surface of the upper chamber body may match an angle of the internal surface. The internal surface may be funnel shaped and the internal surface of the upper chamber body adjacent to an internal surface of the lower chamber body curve downward. The internal surface of the upper chamber body may be funnel shaped and curve downward toward the chuck.

In another embodiment, the injector has a tapered lower portion, which may have first and second regions that taper at different rates. The internal surface of the upper chamber body may match an angle of taper of at least one of the first and second regions.

In another embodiment, the injector is disposed between the gas source and the cavity. The injector may be attached to and contact the gas source. O-rings may be disposed between the injector and the gas source and between the injector and the upper chamber body and the injector contain a slot that is substantially parallel to a central axis of the injector inside at least one of the O-rings. Alternatively, the injector may contain a gap inside the O-ring between at least one of: a surface of the injector and a surface of the gas source; and a surface of the injector and a surface of the upper chamber body.

In another embodiment, the injector contains a temperature adjustment system that permits manual or automatic adjustment of a temperature of the injector. The temperature adjustment system may comprise a cooling channel with a cooling liquid in the injector, and a temperature sensor that senses the temperature of the injector and an electrical heater that alters the temperature of the injector.

The following figures and detailed description of the preferred embodiments will more clearly demonstrate these and other aspects of the invention.

DETAILED DESCRIPTION OF THE PRESENTLY PREFERRED EMBODIMENTS

A gas chamber is described for improving flow of a gas and increasing a strip rate of photoresist on a wafer disposed within the chamber. The gas chamber has a tailored upper chamber body and a gas injector that disperses the gas around the chamber while having a very small surface area to which the gas is exposed. In addition, the gas injector is smaller than known baffles or showerheads, as well as being more economical to manufacture due to its smaller size and relatively simple and short machining process. The term gas, as used herein, includes a gas containing radicals, i.e. a plasma.

In a stripping process using a gas, typically the gas has a high flow rate and high pressure. As one example, the flow rate of the gas can be 5 standard liters per minute (slm) at 1 Torr. For a gas, the mean free path at this pressure can be obtained with the following equation:

$$L = \frac{kT}{\sqrt{2}\,\pi P d^2}$$

where L is the mean free path of the gas, k is the Boltzmann constant, T is the absolute temperature of gas, P is pressure and d is the diameter of the gas molecule. As one example, the mean free path of an oxygen molecule is around 0.06 mm at room temperature. When a gas is ignited, however, the gas temperature rises dramatically. If the gas temperature rises to 1000° K, the mean free path of oxygen increases to around 0.2 mm. These values are much smaller than any geometric feature of a wafer-processing chamber. The gas flow may be treated as, therefore, a viscous flow in which Newtonian gas dynamics dominates.

A high gas stream velocity is the direct result of high gas-flow processes. A typical recipe for stripping photoresist from the surface of a semiconductor wafer calls for a flow rate of 5 slm $O_2/N_2$ at 1 Torr. Under these flow and pressure conditions, the gas velocity leaving the gas source with an exit diameter of 2.5 cm, for example, is around 177 m/sec. To obtain a uniform strip pattern, a uniform vertical gas flow at the wafer surface is used. At 177 m/sec, the gas will not typically disperse uniformly across the surface of the wafer unless a dispersal unit is present in the gas flow.

Figure 4:
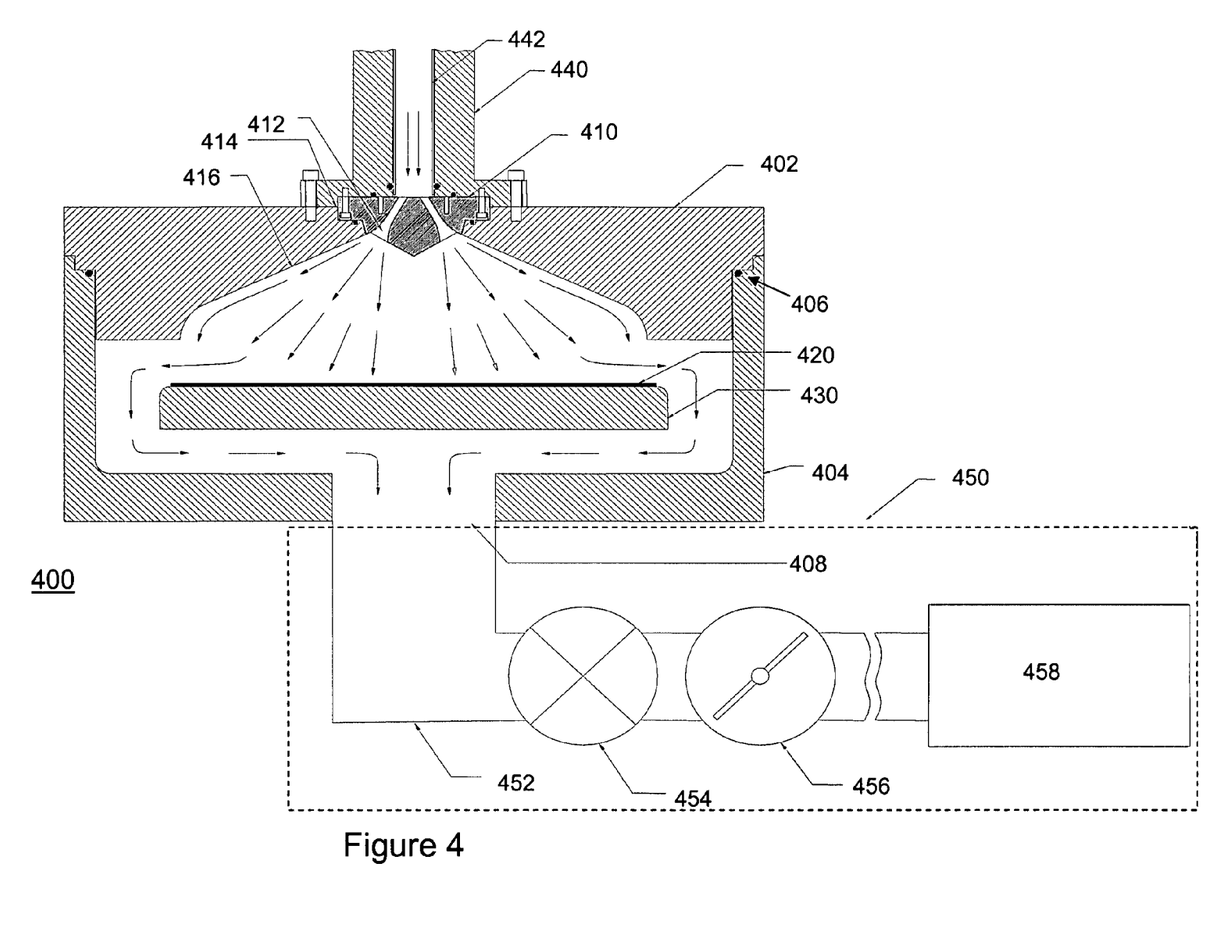
FIG. 4 illustrates a gas chamber according to one aspect.

As shown in FIG. 4, the gas chamber 400 contains upper and lower chamber bodies 402 and 404, a remote gas source 440, and an exhaust unit 450. The upper and lower chamber bodies 402 and 404 form a cavity 416 in which a vacuum is generated. An O-ring 406 disposed between the upper and lower chamber bodies 402 and 404 permits the vacuum to be maintained. The gas source 440 is microwave or RF-powered and excites a process gas entering the source and creates a plasma. Typical gases include oxygen, nitrogen, chlorine, argon, xenon depending on the desired process. The gas source 440 typically contains a gas transport tube 442 that contains sapphire.

The gas source 440 is attached to the upper chamber body 402 of the gas chamber 400 using screws or bolts. The gas source 440 communicates with the upper chamber body 402 through an injection port 414 such that the gas is transported downstream to the upper chamber body 402 through channels 412 in an injector 410. In one embodiment, the injection port 414 has a diameter of about 2.5 cm, which is the same size as a typical gas transport tube 442 of the gas source 440. The gas source 440 is preferably cooled, by water for example.

Once the gas has been dispersed by the injector 410, it is confined by the walls of the cavity 416 in the upper chamber body 402 and impinges evenly on a wafer 420 disposed on a temperature controlled chuck 430. The injector 410, wafer 420 and chuck 430 are disposed in the cavity 416 formed by the upper and lower chamber bodies 402 and 404. In one embodiment, the cavity 416 has a diameter of about 33 cm to 41 cm and a height of about 10 cm to 30 cm. Although the wafer 420 may have any diameter, typically 6 inch, 8 inch or 12 inch wafers are used in semiconductor fabrication.

The gas, in one embodiment, ashes a photoresist layer remaining from an earlier process. The earlier process may be any semiconductor fabrication process, for example, ion implantation, etching, or metal deposition. The gas is then drawn from the lower chamber body 404 via an exit port 408 and through a series of vacuum components by a vacuum pump 458. These vacuum components include, for example, a vacuum line 452, an isolation valve 454, and a throttle valve 456.

In FIG. 4, the injector 410 is located right below the gas source 440 and above the upper chamber body 402. There are multiple flow channels 412 inside the injector 410. The flow channels 412 are angled away from the center line of the upper chamber body 402. The angled flow channels divide and direct the gas stream from the source evenly toward the wafer 420. The diameter and number of the flow channels are selected so that they provide uniform gas distribution over the wafer but do not create a large amount of back pressure in the gas source 440. A high back pressure in the source can result in poor gas ionization and high radical recombination.

For a chamber pressure of 1 Torr and a flow rate of 5 slm, the injector 410 creates a back pressure of about 4 Torr in the gas source 440, well below the 10 Torr back-pressure which severely decreases the number of radicals produced in the gas source 440. In this example, the injector 410 has a gas-exposed surface area of about 46 cm$^2$, which includes the top surface, the walls of the flow channels and the bottom surface of the injector 410. As a comparison, the single baffle structure of FIG. 1 has a surface area of over 2000 cm$^2$.

While radicals can still recombine inside the flow channels 412 of injector 410 due to collision of the molecules with the channel walls, the recombination is minimal due to the small channel wall surface and the high gas velocity inside the flow channels 412. The diameters of the flow channels 412, although small, are still much larger than the mean free path of the gases flowing therethough at the pressure and temperature used. The average velocity of the gas flowing through the flow channels 412 and under the flow conditions stated previously is around 260 m/sec. At this flow rate, it only takes a molecule about 12 μs to travel through the flow channels 412. Therefore, only a small amount of radicals are neutralized when passing through the flow channels 412.

Figure 5:
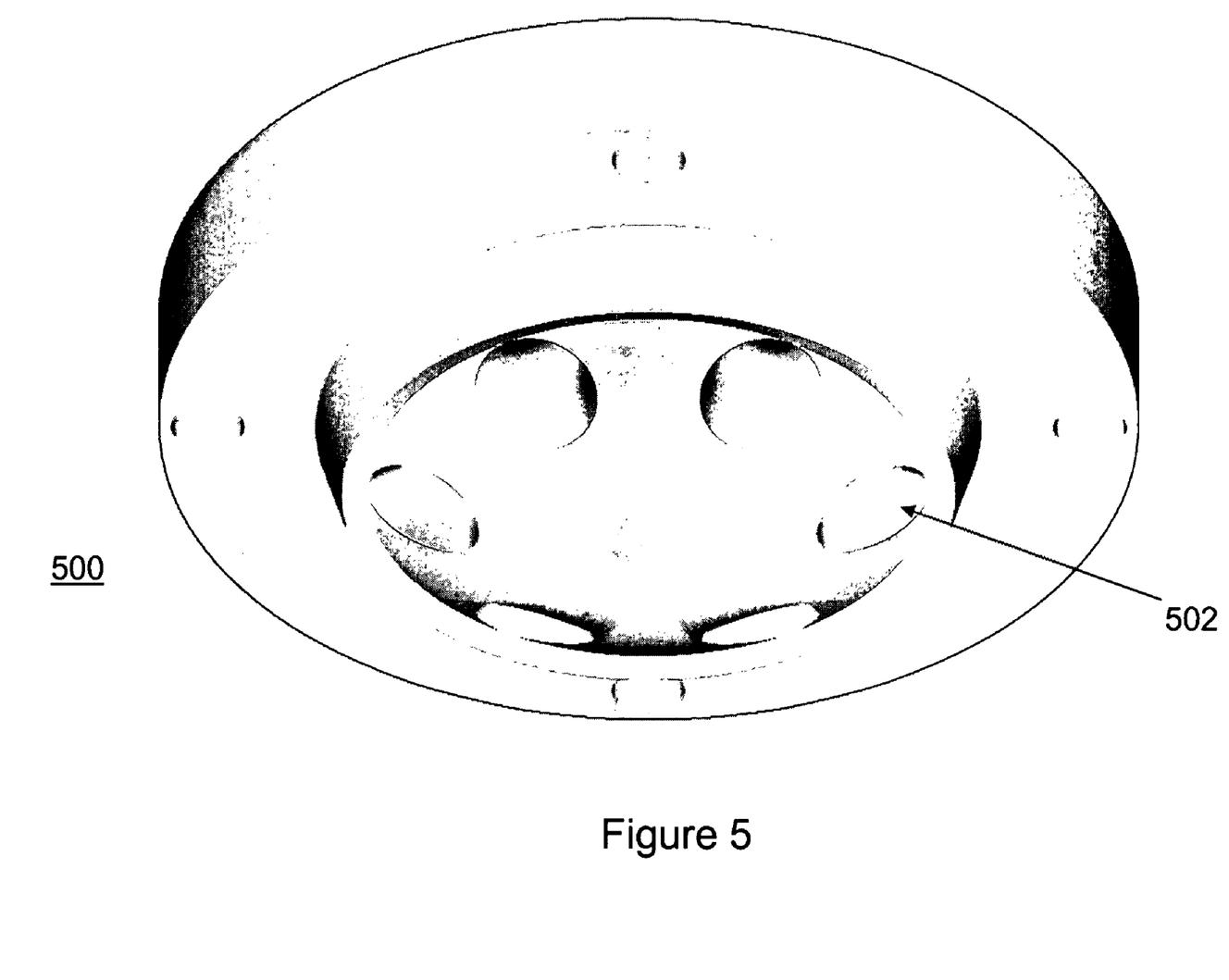
FIG. 5 illustrates a perspective view of a dispersing component according to one aspect.
Figure 6:
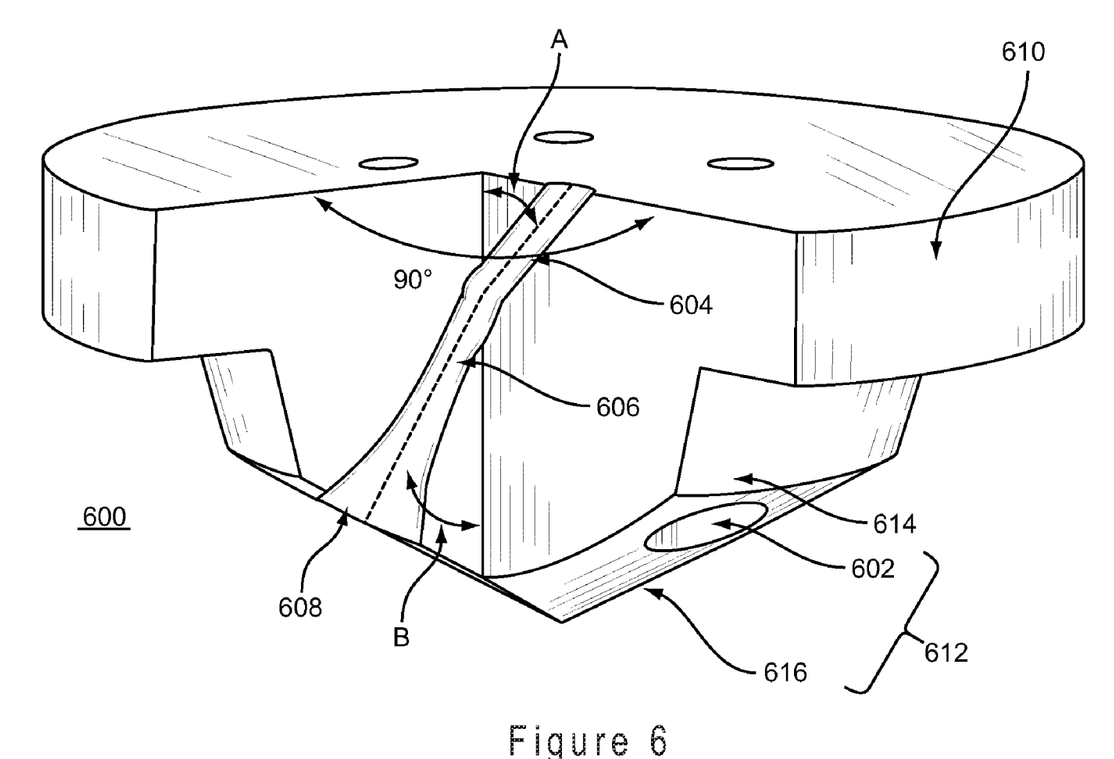
FIG. 6 illustrates a cross-sectional view of a dispersing component according to a second aspect.

In one example, as shown in the perspective view of FIG. 5, the injector 500 contains six flow channels 502. Each flow channel has a diameter of about 0.4 cm and is about 2.7 cm long. Although FIG. 5 shows a six channel injector, an injector with additional or fewer channels may be used as desired. FIG. 6, for example, shows a four channel injector 600. As can be seen by the cut-away view, the channels of the injector contain one or more bends. Each channel is bent at a sufficient angle to minimize or eliminate ultraviolet (UV) rays and charged molecules generated in the gas source where the gas is ionized from substantially passing directly from the entrance of the channel to the exit of the channel. In other words, the UV rays do not substantially pass from the entrance to the ext without being reflected. If not properly blocked, the UV rays and charged molecules can travel to the wafer and damage the circuit.

As shown in FIG. 6, the injector 600 has an upper portion 610 and a lower portion 612. The upper portion 610 is substantially cylindrical and is used to couple the injector 600 to the remote gas source and the upper chamber body, discussed in more detail below. The lower portion 612 has first and second regions 614 and 616 that taper at different rates with increasing distance from the remote gas source. The lower portion 612 has a smaller diameter than the diameter of the upper portion 610. The first and second regions 614 and 616 may have other shapes, e.g., spherical or cylindrical. Similarly, although the first and second regions 614 and 616 are shown as tapering at different rates, the first and second regions 614 and 616 may have the same taper (e.g., be substantially a single conical or spherical structure) or have no taper (e.g., be substantially cylindrical with one or more cylinders of one or more diameters).

In addition, each channel 602 has an upper section 604 and a lower section 606. The lower section 606 contains a nozzle 608 from which the gas is ejected. The diameter of the channel 602, except the nozzle 608, remains substantially constant. The nozzle 608 has a diameter that increases with decreasing distance to the end of the channel 602. In the embodiment shown, the nozzle 608 is substantially funnel-shaped.

The upper section 604 of one channel has an inclination angle A from the central axis of the injector 600 that is substantially perpendicular to the angle B of the lower section of the channel. The angle of the lower section 606 determines the angle of the gas exiting the flow channel 602 and is used to adjust the flow pattern at the wafer. Gas flow is more focused toward the center with smaller angles, and is more spread-out with larger angles. Different flow and pressure conditions and gas types may use injectors with different angles to be optimized for best overall performance. For example, angle A ranges from about 0° to 60° from the central axis of the injector 600 while angle B ranges from about 10° to 60° from the central axis of the injector 600.

By using perpendicular planes of angles for the upper and lower section 604 and 606, a direct line of sight through the channel 602 can be avoided. Thus, UV rays can be blocked while the B angle can be varied to optimize the design of the injector for strip uniformity. Moreover, to reduce ions reaching the wafer, the injector forces the ionized gas stream to turn sharply. Sharp turns facilitate wall collision and therefore help to neutralize ions. This permits a controlled reduction in the number of ions leaving the injector. Note that although only channels with a single bend (i.e. only two sections) are shown, the channels may have multiple sharp bends (i.e. more than two sections). Alternatively, the channels may be curved to eliminate line-of-sight from the entrance to the exit of the channel and force the gas molecules to collide with the surface along the curve.

In other examples, the diameter of the injector may range from about 5 cm to 13 cm, while the thickness ranges from about 1 cm to 13 cm. From 3 to 24 flow channels are present in the injector. These flow channels have a diameter that may range from about 0.3 cm to 1 cm and extend in length from about 1 cm to 5 cm.

Strip uniformity is affected by different features in the chamber. The angle of the lower channel of the injector controls the direction of the gas streams coming out of the nozzles, and thus alters the strip uniformity from the center to the edge of the wafer. The flaring exit of the nozzle helps fan out the gas stream coming out of the nozzle, and thus improves the circumferential uniformity.

In addition, the funnel-shaped upper chamber body, shown in FIG. 4, affects the gas flow pattern after the gas exits from the injector. The inner surface of the upper chamber body is continuous so that the gas flowing out of the injector is confined in the upper chamber body. The funnel shape lessens recirculation of the gas after the gas has left the injector. The funnel surface curves downward when reaching the lower chamber body (or the edge of the wafer), which further confines and guides the gas to control the strip rate at the wafer edge.

The funnel shape of the top of the upper chamber body reduces the volume of the space formed by the upper and lower chamber bodies compared with the volume used by the cylindrical upper chamber body shown in FIGS. 1 and 3. This reduces the amount of time it takes to pump down the chamber from atmospheric pressure to the pressure used during the process as well as reducing the amount of time it takes to vent to the atmosphere. Some strip chambers use pumping and venting for every wafer processed, resulting in a large decrease in throughput, i.e. a large increase in time to process, for a batch of wafers. Other strip chambers, which are designed to cluster around a central wafer-transferring vacuum chamber, use partial venting to a pressure higher than the process pressure to improve the heat transfer between the chuck and the wafer. The chamber is then pumped down to the process pressure after the wafer heating is complete.

Control of the injector's temperature helps to achieve consistent process results. For example, the surface recombination efficiency of the gas radicals recombining on the surface of the injector varies with the temperature of the surface. Depending on the gas chemistry, the recombination rate can be proportional to the temperature or can be inversely proportional to the temperature. However, it can difficult to regulate the typical baffle's temperature due to the size of the typical baffle shown in FIGS. 1 and 3. When the temperature of the baffle varies, the process results may differ from wafer to wafer. It is also difficult to keep a baffle's temperature uniform. For the chambers shown in FIGS. 1 and 3, the temperature of the baffle is higher at the center of the baffle since this area is directly under the plasma source and receives more heat load than other areas of the baffle. A non-uniform temperature profile causes the baffle surface to have non-uniform radical recombination efficiency, which further complicates the process.

Figure 7:
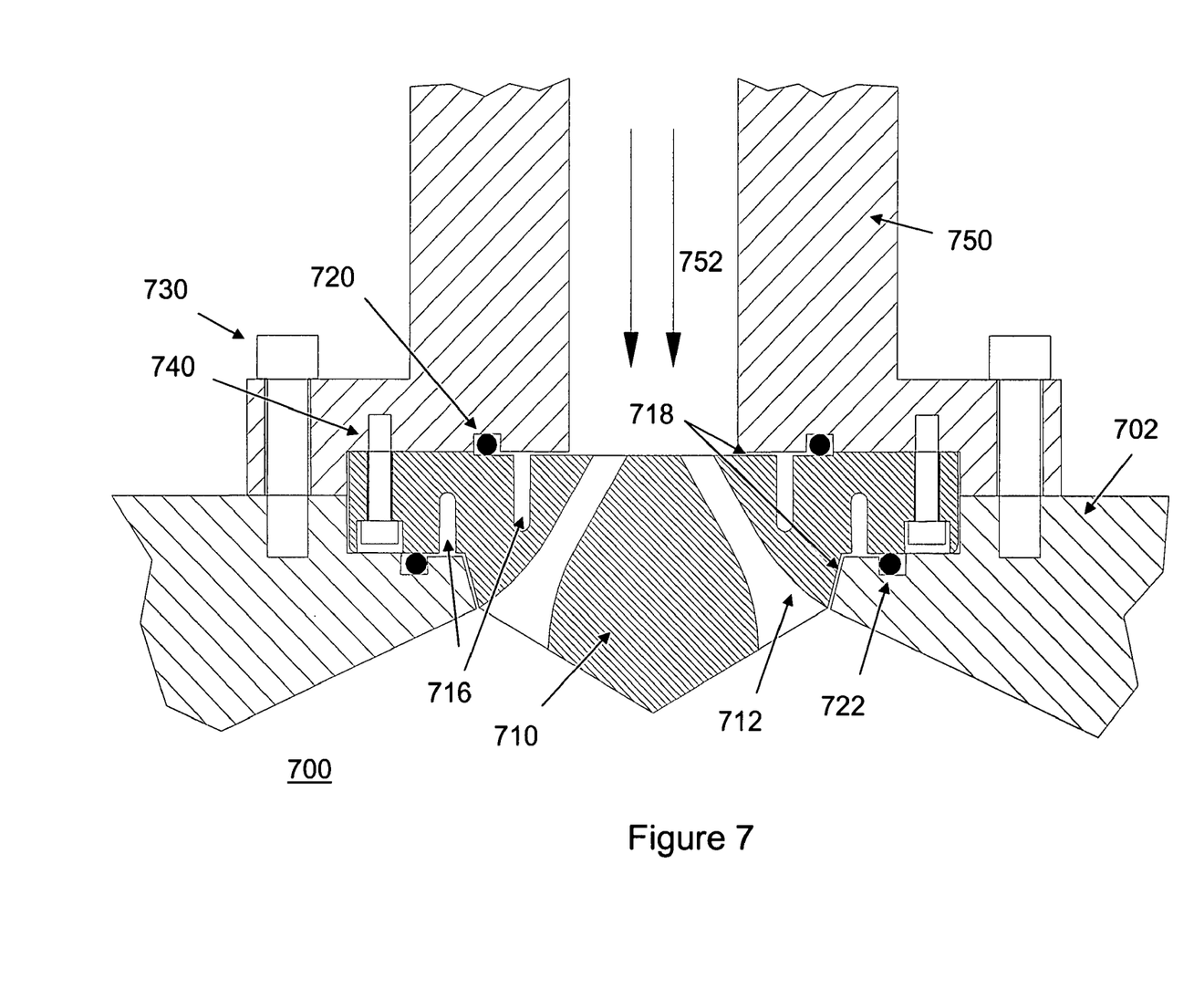
FIG. 7 illustrates a cross-sectional view of a dispersing component according to a third aspect.

However, as the injector is significantly smaller than the typical baffle, it is easier to control the injector's temperature. FIG. 7 illustrates a close up cross-sectional view of one embodiment of the gas chamber 700. The gas chamber 700 contains an upper chamber body 702, an injector 710 and a gas source 750. The gas source 750 is coupled to the upper chamber body 702 by screws 730. Similarly, the injector 710 is coupled to the gas source 750 by screws 740. The gas source 750 generates plasma 752, which is supplied through the channels 712 in the injector 710 to the upper chamber body 702. The gas source 750 contains a recess in which an upper vacuum O-ring 720 is disposed, while the upper chamber body 702 contains a recess in which a lower vacuum O-ring 722 is disposed. The injector 710 also includes slots 716 and gaps 718, as discussed below.

As shown in FIG. 7, to keep the temperature under control, the injector 710 is designed to have a large thermal contact area, which is at atmospheric pressure. The thermal contact area is the area of the injector 710 outside the vacuum O-rings 720, 722. The screws 730 and 740 provide tight contact between the injector 710 and the gas source 750/upper chamber body 702 to produce a good heat transfer path between the thermal contact area and the gas source 750. The thermal energy received from the plasma 752 is transferred to the gas source 750 or to the upper chamber body 702 through the thermal contact area. The transfer of this energy is efficient enough to maintain the injector at or below a desired temperature.

Figure 8:
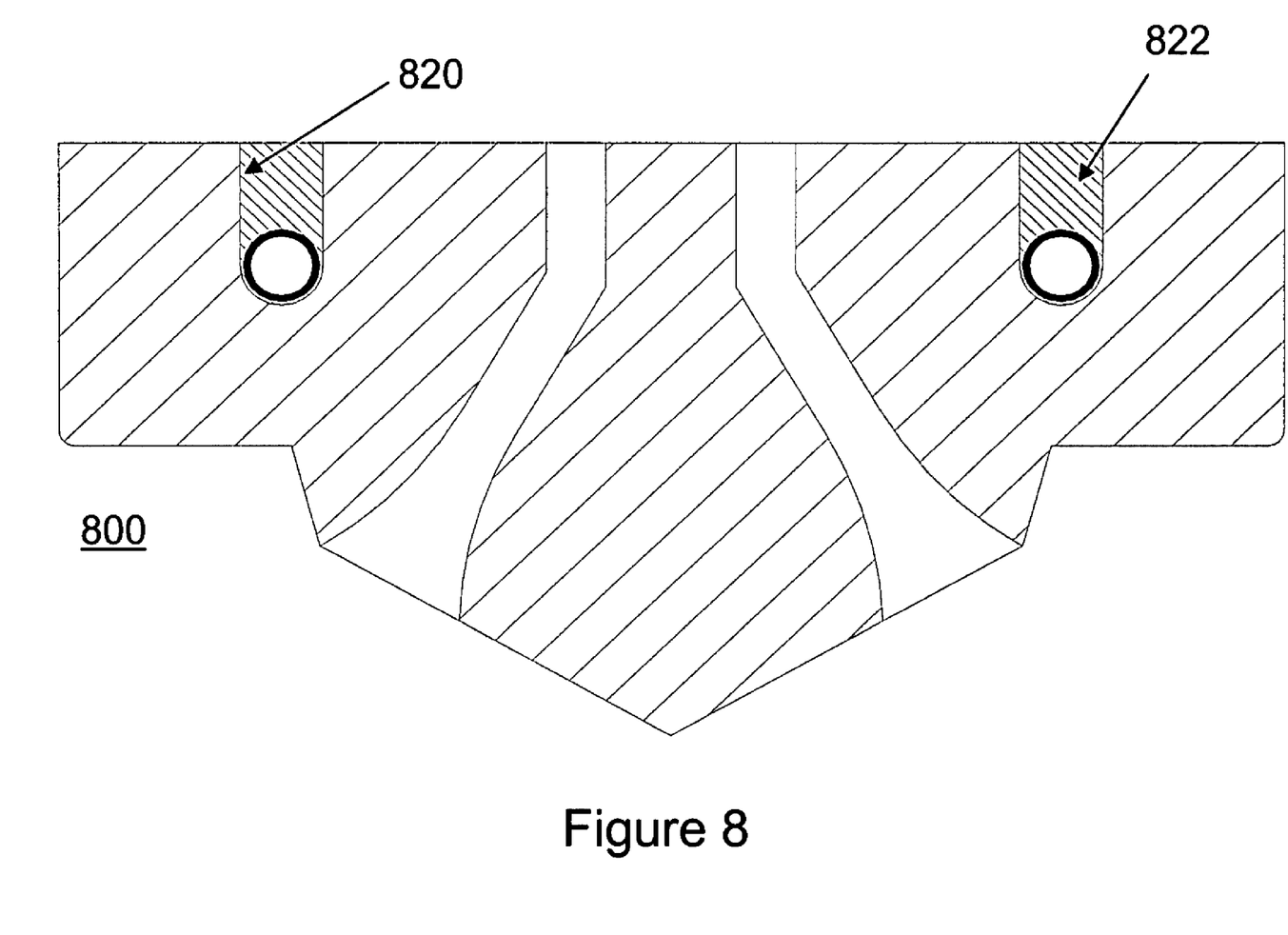
FIG. 8 illustrates a cross-sectional view of a dispersing component according to a fourth aspect.

As shown in FIG. 8, the injector 800 can also be formed with one or more cooling channels 820 that contain a cooling liquid 822, which permits a larger amount of heat to be removed. To maintain the injector 800 at a constant temperature, the cooling fluid 820 can be circulated through a temperature control unit (not shown). The injector's temperature can then be controlled by setting the temperature of the cooling liquid 822 at the temperature control unit. The cooling liquid in each cooling channel can be the same or different.

Figure 9:
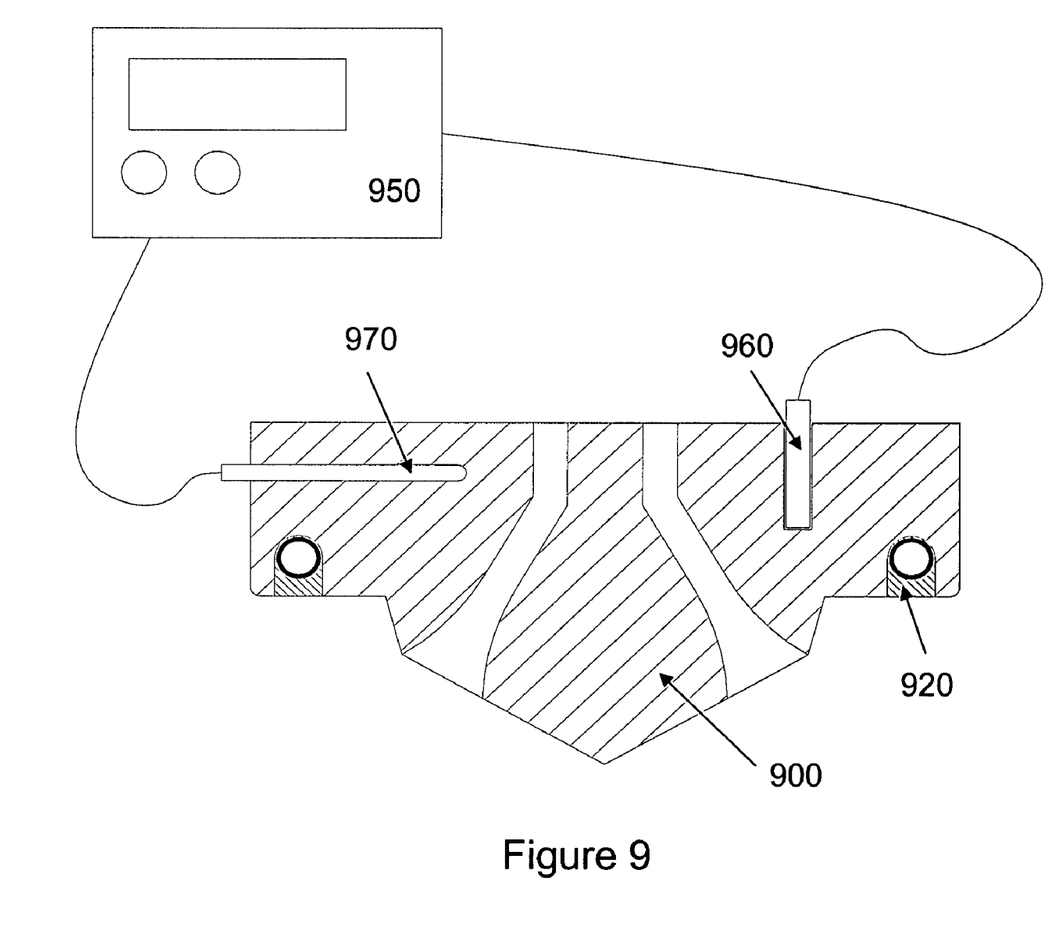
FIG. 9 illustrates a cross-sectional view of a dispersing component according to a fifth aspect.

If active temperature control is desired, a combination of heating and cooling may be used. Electrical heaters 960, as shown in FIG. 9, can be inserted into the injector 900 separately from the cooling channels 920. The electrical heaters may be, for instance, resistors. A temperature controller 950 can be used to control the current to the electrical heaters 960 to adjust the temperature of the injector 910. The heaters 960 may be controlled individually or in one or more groups. Additionally, one or more temperature sensors 970 may be inserted into the injector 900. The temperature sensor 970 may be, for example, a thermocouple or Resistance Temperature Detector (RTD). Alternatively, thermoelectric elements can be used to control the temperature of the injector, replacing the heaters and cooling channels.

Besides process variation, temperature changes of the various components in the gas chamber may cause other problems. For example, even with relatively good heat transfer, the injector's temperature is still higher than that of the mating parts (e.g. the gas source and the upper chamber body). Thermal expansion mismatch between the injector and the mating parts in the injector area produces mechanical stress. This mechanical stress can deform or damage the injector or the mating parts. To alleviate this, one or more slots 716 are formed in the injector 710. The slots 716 are circular vertical slots on each side of the injector 710, which act as thermal expansion relief slots.

In addition, thermal mismatch may cause particle contamination. As the injector heats up and cools down, it expands and contracts relative to the mating parts. As a result, rubbing occurs between mating surfaces of the injector and the mating parts. Rubbing creates particles, which if introduced are detrimental to wafers in the chamber. To avoid rubbing of the mating surfaces, a small gap 718 of 0.13 mm or less is introduced between the mating surfaces inside the vacuum O-rings 720 and 722. Although gaps can be provided in areas outside the O-rings 720 and 722, they are not shown in FIG. 7 as the O-rings 720 and 722 effectively exclude particles outside the O-rings 720 and 722 from entering the chamber 700.

The injector and the upper and lower chamber bodies as well as the injector can be manufactured using all plasma-resistant material. The plasma-resistant material can be formed from metallic or non-metallic material. If one or more metals are used to form the injector, the injector can include, for example, aluminum and aluminum alloys, stainless steel and high nickel alloys, quartz, aluminum oxide ceramic, aluminum nitride ceramic, and/or yttrium oxide ceramic.

Parts fabricated using metals can be protected against corrosion with plasma resistant coatings. In one example, aluminum may be used as its natural surface oxide provides an excellent corrosion barrier. However, when using fluorine based chemistry and under certain process conditions, the aluminum native oxide does not provide sufficient protection to avoid formation of aluminum fluoride, which causes contamination on wafers. To prevent metallic fluorides from forming on metal parts, coatings that have superior resistance to fluorine chemistry can be applied to the surface of metal parts. Coatings such as anodization over aluminum and its alloys and plasma sprayed aluminum oxide, nickel plating, quartz, yttrium oxide and/or other ceramic materials may be used for protection from various chemistries.

Turning back to FIG. 4, the wafer 420 lies on a wafer heating chuck 430 in the chamber. Before strip process can be conduced, wafers are heated to a temperature high enough to accelerate the chemical reaction. Wafer heating is non-trivial as the strip uniformity is directly related to the temperature uniformity at the wafer. The wafer is heated as quickly as possible to reduce the time the wafer is in the chamber that is non-productive. Although electrostatic chucks may be used in stripper applications, they are expensive and may not be reliable. However, an electrostatic chuck has an electrically-induced clamping force that pulls the wafer closer to the chuck for good heat transfer, which a non-electrostatic chuck may not have. One way to mitigate such a problem is to control the flatness of the chuck to within a particular amount. In one example, to provide a fast heat transfer and uniform wafer temperature when using a non-electrostatic chuck, the non-electrostatic heater chuck has a global flatness of better than about 27 μm.

In addition, pumping of the chamber affects the strip rate of the photoresist on the wafer. Strip processes are usually high-flow (e.g., several slm) and high-pressure (e.g., 750 mTorr or higher). Accordingly, strip processes are not entirely in either a viscous flow regime or a molecular flow regime. To provide uniform pumping, a single pump port 408 is located at the center of the lower chamber body 404.

Other systems can be incorporated in the chamber to improve the process results. An optical spectrum end-point detector, for example, is one such system. Either a narrow band or a broad band optical wavelength detector is attached to a view port at the side of the chamber looking directly at the bulk plasma above the wafer plane. The chemical reaction at the wafer surface between the photoresist and the plasma emits a particular signature spectrum. Once the photoresist is depleted, this spectrum changes immediately. This optical signal change determines the end of the strip process. End point detection has become sophisticated enough to determine the transition of multi-layer strip process such as high dose implanted resist removal. This type of resist has a hard crust due to the implant process. Chemistry designed to break through the crust is different from that designed to strip the rest of the resist under the crust. With proper setup, an optical detector is able to determine this transition as the optical spectrum changes when the crust has etched through. This change of signal allows the software to change the chemistry in the plasma and switch to a different recipe for the bulk resist removal. However, systems such as the optical spectrum end-point detector described above add cost, weight and size.

A gas chamber has been described that contains a single injector having channels through which a gas passes into a vacuum chamber. The channels have portions that are substantially perpendicular to each other. The portions are disposed at angles of up to about 60° from a central axis of the injector. The channels have funnel-shaped end portions. The chamber has a tapered upper portion that is matched to the angle of the funnel-shaped end portions of the injector and disperses the gas ejected from the injector. The injector is small and relatively simple to manufacture.

While specific embodiments have been described, the descriptions herein are illustrative only and not to be construed as limiting the invention. Various modifications, such as differences in materials and/or dimensions, and applications may occur to those skilled in the art without departing from the true spirit and scope of the invention as defined in the appended claims.

The invention claimed is:

1. An apparatus for delivering gas to a substrate, the apparatus comprising:
   upper and lower chamber bodies forming a cavity;
   a gas source in fluid communication with the cavity;
   an exhaust unit adapted to remove gas in the cavity;
   a chuck disposed in the cavity; and
   an injector containing a plurality of continuous channels extending therethrough, each channel in communication with the cavity and the gas source, wherein each channel is independent from one another and comprises:
   a first section having a first diameter and a longitudinal axis along a direction of the first section connected to a second section having a second diameter and a longitudinal axis along a direction of the second section, where an intersection between the first section and the second section is at an angle sufficient to prevent light rays that enter the first section along the direction of the longitudinal axis of the first section from exiting the second section without reflecting from a surface in the channel and where the first diameter is substantially equal to the second diameter at the intersection.

2. The apparatus of claim 1, wherein at least one of the channels has a first inclination angle in the first section of the injector substantially perpendicular to a second inclination angle of the second section of the injector.

3. The apparatus of claim 2, wherein at least one of the first and second inclination angles is oblique from a central axis of the injector.

4. The apparatus of claim 3, wherein the first inclination angle ranges from about 0° to 60° from the central axis of the injector while the second inclination angle ranges from about 10° to 60° from the central axis of the injector.

5. The apparatus of claim 1, wherein a nozzle at an end of at least one of the channels is substantially funnel shaped.

6. The apparatus of claim 5, wherein an angle at the end of the nozzle adjacent to an internal surface of the upper chamber body matches an angle of the internal surface.

7. The apparatus of claim 6, wherein the internal surface is funnel shaped.

8. The apparatus of claim 1, wherein the injector has a tapered lower portion.

9. The apparatus of claim 8, wherein the tapered lower portion has first and second regions that taper at different rates.

10. The apparatus of claim 9, wherein an internal surface of the upper chamber body matches an angle of taper of at least one of the first and second regions.

11. The apparatus of claim 1, wherein the injector contacts the gas source.

12. The apparatus of claim 11, further comprising O-rings between the injector and the gas source and between the injector and the upper chamber body, wherein the injector contains a slot inside at least one of the O-rings, the slot substantially parallel to a central axis of the injector.

13. The apparatus of claim 11, further comprising O-rings between the injector and the gas source and between the injector and the upper chamber body, wherein the injector contains a gap inside the O-ring between at least one of: a surface of the injector and a surface of the gas source; and a surface of the injector and a surface of the upper chamber body.

14. The apparatus of claim 1, wherein the injector further comprises a temperature adjustment system that permits manual or automatic adjustment of a temperature of the injector.

15. The apparatus of claim 14, wherein the temperature adjustment system comprises a cooling channel in the injector, the cooling channel containing a cooling liquid.

16. The apparatus of claim 15, wherein the temperature adjustment system further comprises a temperature sensor that senses the temperature of the injector and an electrical heater that alters the temperature of the injector.

17. An apparatus comprising:
upper and lower chamber bodies forming a cavity;
a gas source in fluid communication with the cavity;
an exhaust unit adapted to remove gas in the cavity;
a chuck disposed in the cavity; and
an injector containing a plurality of continuous channels extending therethrough, each channel in communication with the cavity and the gas source, wherein each channel is independent from one another and bent sufficiently to prevent any light ray which enters the channel from exiting the channel without reflecting from a surface in the channel.

18. The apparatus of claim 17, wherein a funnel-shaped nozzle is disposed at an end of at least one of the channels.

19. The apparatus of claim 17, wherein an angle at an end of the nozzle adjacent to an internal surface of the upper chamber body matches an angle of the internal surface.

20. The apparatus of claim 19, wherein the internal surface is funnel shaped.

21. The apparatus of claim 17, further comprising O-rings between the fixture and the gas source and between the fixture and the upper chamber body, wherein the fixture contains a slot inside at least one of the O-rings, the slot substantially parallel to a central axis of the fixture.

22. The apparatus of claim 17, further comprising O-rings between the fixture and the gas source and between the fixture and the upper chamber body, wherein the fixture contains a gap inside the O-ring between at least one of: a surface of the fixture and a surface of the gas source; and a surface of the fixture and a surface of the upper chamber body.

23. The apparatus of claim 17, wherein the fixture further comprises a temperature adjustment system that permits manual or automatic adjustment of a temperature of the fixture.

24. The apparatus of claim 23, wherein the temperature adjustment system comprises a cooling channel in the fixture, the cooling channel containing a cooling liquid.

25. The apparatus of claim 24, wherein the temperature adjustment system further comprises a temperature sensor that senses the temperature of the fixture and an electrical heater that alters the temperature of the fixture.

26. An apparatus for delivering gas to a substrate, the apparatus comprising:
upper and lower chamber bodies forming a cavity;
a gas source in fluid communication with the cavity;
an exhaust unit adapted to remove gas in the cavity;
a chuck disposed in the cavity; and
an injector comprising a unitary structure that contains a plurality of channels extending therethrough, each channel in communication with the cavity and the gas source, wherein each channel has an upper section and a lower section located in the unitary structure, where the intersection between the upper section and lower section is at an angle sufficient to prevent any light ray which enters the upper section of the channel from exiting the lower section of the channel without reflecting from a surface in the channel.

27. The apparatus of claim 26, wherein at least one of the channels has a first inclination angle in the upper section of the injector substantially perpendicular to a second inclination angle of the lower section of the injector.

28. The apparatus of claim 27, wherein at least one of the first and second inclination angles is oblique from a central axis of the injector.

* * * * *